United States Patent [19]
Riley et al.

[11] Patent Number: 4,676,868
[45] Date of Patent: Jun. 30, 1987

[54] METHOD FOR PLANARIZING SEMICONDUCTOR SUBSTRATES

[75] Inventors: Paul E. Riley, San Jose; Alan B. Ray, Palo Alto; Paul Bayer, San Jose, all of Calif.

[73] Assignee: Fairchild Semiconductor Corporation, Cupertino, Calif.

[21] Appl. No.: 855,207

[22] Filed: Apr. 23, 1986

[51] Int. Cl.⁴ ............... B44C 1/22; B29C 37/00; C03C 15/00; C03C 25/06
[52] U.S. Cl. .................... 156/643; 156/646; 156/652; 156/653; 156/655; 156/657; 156/659.1; 204/192.32
[58] Field of Search ............... 156/643, 646, 652, 653, 156/655, 657, 659.1, 662, 651, 668; 29/576 W, 591; 427/38, 39, 88, 89, 90, 93; 204/192 E; 357/65, 71; 252/79.1

[56] References Cited

U.S. PATENT DOCUMENTS

| | | | |
|---|---|---|---|
| 4,358,356 | 11/1982 | Silverman | 204/192 E |
| 4,377,438 | 3/1983 | Moriya et al. | 156/643 |
| 4,479,848 | 10/1984 | Otsubo et al. | 156/626 |
| 4,511,430 | 4/1985 | Chen et al. | 156/657 |
| 4,523,975 | 6/1985 | Groves et al. | 156/657 X |
| 4,545,852 | 10/1985 | Barton | 156/653 X |
| 4,604,162 | 8/1986 | Sobczak | 156/643 X |

OTHER PUBLICATIONS

Bowling and Larrabee (1985) J. Electrochem. Soc. 132:141.
Johnson et al. (1982) App. Phys. Lett. 40:636.
Johnson et al. (1983) J. Vac. Sci. Technol. B1:487.
Mogami et al. (1985) J. Vac. Sci. Technol. B3:857–861.
Adams and Capio (1981) J. Electrochem. Soc. 128:423.
Schiltz and Pons (1986) J. Electrochem. Soc. 133:178–181.
Mercier et al. (1985) J. Electrochem. Soc. 132:1219–1222.

*Primary Examiner*—William A. Powell
*Attorney, Agent, or Firm*—Townsend & Townsend

[57] ABSTRACT

A method for planarizing an insulating layer overlying an irregular topographic substrate, e.g., a conductive layer, is planarized by use of a sacrificial planarization layer. The planarization layer is removed using an oxygen-containing plasma generated in a parallel electrode reactor operating at a low excitation frequency and high pressure. Once the interface between the planarization layer and the conductive layer is reached, a second plasma with a reduced oxygen content is employed to avoid overetching the planarization layer. It has been observed that oxidizing species liberated during the etching of the insulating layer, typically silicon dioxide, contribute to the oxidation and hence removal of the planarization layer. The process may be monitored by observing the spectral emissions from species generated or consumed during planarization or by changes in the optical interference pattern, allowing termination of the etch at the proper time to avoid over-etching and under-etching of the insulating layer.

26 Claims, 4 Drawing Figures

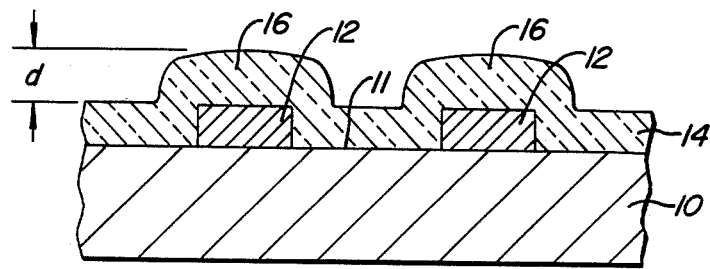
FIG._1.
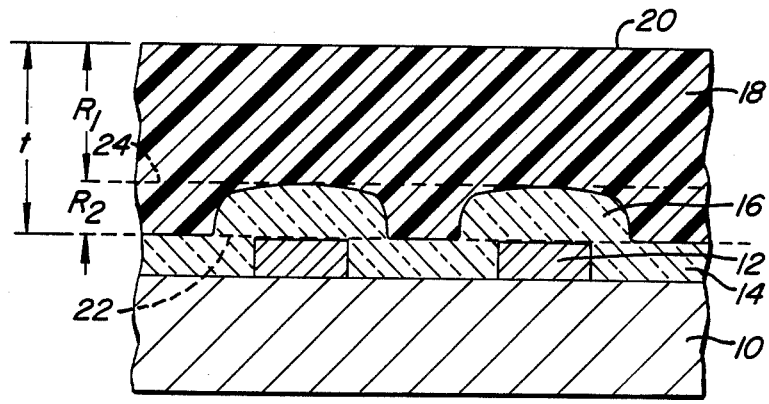
FIG._2.
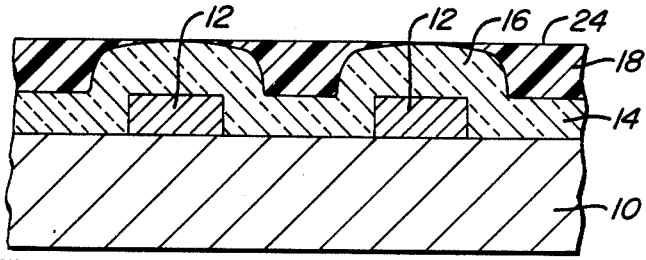
FIG._3.
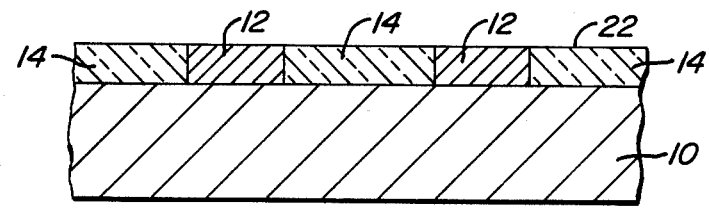
FIG._4.

METHOD FOR PLANARIZING SEMICONDUCTOR SUBSTRATES

BACKGROUND OF THE INVENTION

1. Field of the Invention

The present invention relates generally to semiconductor wafer fabrication, and more particularly, to a method for planarizing insulating layers on such substrates.

Planarization of semiconductor substrate surfaces during the fabrication of fine-geometry integrated circuits is necessary to improve both photolithographic feature resolution and dimensional control and to alleviate metallization discontinuity which may result from abrupt changes in topography.

Three methods are commonly employed for achieving such planarization. The simplest approach, referred to as doped oxide reflow, involves heating the wafer to a very high temperature, typically about 1000° C., in order to cause an insulating layer to flow and become level. While suitable for some applications, such a high temperature technique cannot be used with devices having aluminum-based interconnections and/or shallow source and drain junctions. Thus, the method is unsuitable for fabrication of very large scale integration (VLSI) devices.

Two other commonly-employed methods for planarization involve the deposition of a sacrificial leveling layer, such as photoresist, to fill the voids and crevices which are present following application of an insulating layer. The flat surface created by the sacrificial layer is then etched back at a uniform rate to leave a generally flat layer of insulating material having a desired thickness. The first of these methods employs ion beam erosion of the sacrificial and insulating layers which, although workable, is a relatively slow tecnhique capable of removing only about 1000 Å per minute. Thus, the technique is generally unsuitable for the removal of thick sacrificial layers, on the order of 20,000 to 40,000 Å, required to planarize metallization layers.

The second technique utilizes conventional high frequency low pressure batch plasma etching for removing the sacrificial layer. Such conventional batch etching techniques, however, are inherently non-uniform, causing both a loss of planarity across individual wafers as the etch proceeds and variations among different wafers, even though they are processed simultaneously. Thus, since the nature of a batch process requires that all wafers be processed for the same time, optimum control still results in some of the wafers being over-etched with others being under-etched.

For these reasons, it would be desirable to provide improved methods for planarizing substrate surfaces, particularly for planarizing insulating layers overlying uneven topographic features. It is further desirable that such methods be capable of planarizing relatively large and abrupt variations in the underlying topography, and that they be adaptable to wide variations in feature size and feature density on the wafer. Finally, the methods should be rapid so that there is little or no increase in the ovreall fabrication time and should provide for precise end point control to minimize over-etching/under-etching of the planarization and insulating layers.

2. Description of the Relevant Art

Planarization methods employing post-deposition doped oxide reflow are described in Bowling and Larrabee (1985) J. Electrochem. Soc. 132:141. Planarization techniques employing ion beam erosion of sacrificial and insulating layers are described in Johnson et al. (1982) App. Phys. Lett. 40:636; Johnson et al. (1983) J. Vac. Sci. Technol. B1:487; and Mogami et al. (1985) J. Vac. Sci. Technol. B3:857. Methods for planarization using a plasma etch of a sacrificial layer are described in Adams and Capio (1981) J. Electrochem. Soc. 128:423. See also, U.S. Pat. Nos. 4,358,356 and 4,377,438 which discuss alternate planarization techniques.

SUMMARY OF THE INVENTION

The present invention provides a rapid and highly uniform method for planarizing insulating layers formed over semiconductor substrates. The method employs a sacrificial planarization layer which is applied directly over the insulating layer to a thickness sufficient to level topographic irregularities on the surface of the insulating layer. The planarization and insulating layers are then etched back by a novel two-step approach. First, the planarization layer is etched with an oxygen-containing plasma capable of rapidly oxidizing the planarization material (typically an organic polymer such as a photoresist) until the interface between the top of the insulating layer and the planarizing layer is reached. Second, the combined planarization and insulating layer region is plasma etched with a reduced-oxygen etchant which etches a homogeneous organic planarization material at a lower rate than a homogeneous insulating material, typically silicon dioxide. It has been found that the use of such a reduced-oxygen plasma apparently equalizes the etch rates of the insulating material and the planarization material when both are exposed to the plasma simultaneously. It is believed that such equalization results from the release of reactive oxidizing species from the insulating layer as it is etched. These oxidizing species increase the actual etch rate of the organic planarization material relative to what it would have been in their absence. Thus, by appropriately reducing the amount of oxygen in the etchant gas mixture, the increase in oxidizing species resulting from the reaction of the insulating layer may be appropriately balanced. In this way, highly uniform planarization of the insulating layer may be achieved. In the preferred embodiment, a halocarbon etchant is employed which is capable of removing the insulating layer by ion bombardment, but which (in the absence of released oxidizing species) is substantially less-reactive with the organic planarization material.

According to a second aspect of the present invention, either or both of the two plasma etching steps may be performed in a parallel plate plasma reactor under low frequency (typically at or below 1 MHz) and high pressure (typically above 1 Torr.) conditions. Such conditions provide for very rapid etching of the planarization layer, typically at rates at or above 25,000 Å/min., allowing for planarization times on the order of about 2 minutes, depending on the thickness of the planarization and insulating layers. Moreover, by limiting the plasma induction power to from 1 to 5 watts/cm$^2$, a highly uniform etch rate is achieved, typically varying by no more than ±5% usually ±3% or less. Thus, even if the combined thickness of the planarization and insulating layer to be removed is 50,000 Å, the planarity of the resulting etched surface will still be ±2500 Å or less. The parallel plate reactor also promotes removal of the insulating layer by ion bombardment. The combination of rapid removal of a planarization layer and high planarity of the resulting planarized surface provides distinct advantages over prior art planarization methods. Finally, the endpoint of the etch may be monitored by observing either (1) the emission spectra of the plasma, particularly emission from CO molecules, CH fragments, and F or H atoms or (2) changes in the optical interference pattern by means of laser interferometry. Such endpoint control is particularly useful with single wafer reactors where the observed spectra are not an average for multiple wafers which have been etched to varying extents.

BRIEF DESCRIPTION OF THE DRAWINGS

FIGS. 1-4 illustrate the steps of a particular embodiment of the method of the present invention.

DESCRIPTION OF THE PREFERRED EMBODIMENT

The preferred embodiment of the present invention will be described in connection with a particular semiconductor structure comprising a silicon dioxide insulating or dielectric layer applied over a conductive layer, such as metallization or polycrystalline silicon layers. The method employs an organic polymeric material which is applied over the conductive layer to define the planarization surface. While exemplary of the present invention, it should be understood that these are not the only materials which may be employed. Other dielectric materials, such as silicon nitride, silicone oxynitride, polyimides, and the like, may also serve as the insulating material, while the underlying topographic irregularities may result from various surface features, including transistors and other devices, as well as the conductive layer. Organic polymers other than photoresists may also find use as the planarization material. Finally, it should be understood that the method of the present invention may be employed two or more times during the fabrication of a particular integrated circuit on a wafer. The method may be employed any time an insulating layer is applied over an irregular surface, typically between adjacent conductive layers.

Referring now to FIGS. 1-4, a particular embodiment of the method of the present invention will be described. A substrate 10 is a portion of a silicon wafer of the type used in the fabrication of integrated circuits. Typically, the wafer 10 will have been processed by various well-known techniques in order to form a plurality of discrete electronic components, such as transistors, resistors, capacitors, and the like thereon. The surface will have been planarized, either by the method of the present invention or by other well-known techniques, to provide a relatively flat surface 11 upon which metallization lines 12, typically formed from aluminum, aluminum alloys or tungsten, are formed. An insulating layer 14 is formed over the substrate 10 and metallization lines 12 to provide an intermetallic insulation layer for use in multilevel metallization. The insulation layer 14 is usually formed by chemical vapor deposition and will include bumps or domes 16 generally conforming to the underlying metallization lines 12. The metallization lines 12 may have a thickness in the range from 2000 to 10,000 Å, usually in the range from 4000 to 8000 Å, resulting in a bump elevation "d" also in the range from about 2000 to 10,000 Å. Such irregularities on the surface of the insulation layer 14 are undesirable for all of the reasons described above.

Referring now in particular to FIG. 2, a planarization layer 18 is applied over the insulating layer 14. The planarization layer 18 is typically formed from a liquid organic material which may be applied to the wafer by conventional techniques, such as spinning at about 1000 to 5000 rpm, which result in a substantially flat upper surface 20 of the layer 18. After application, the organic polymeric material may be hardened, typically by heating to about 100° to 200° C. or radiation-induced crosslinking of the material. Heating is preferred since it also results in reflow which enhances the flatness of the layer. Suitable organic polymers include polymethyl methacrylate, polymethylisopropenyl ketone, and other photoresists which are frequently employed in conventional photolithographic operations in wafer fabrication. Usually, the organic polymer is applied in incremental layers from about 10,000 to 20,000 Å with each layer being cured prior to the application of the succeeding layer. In this way, relatively thick planarization layers are properly cured and result in a very flat upper surface. Particularly suited as the planarization material are planarizing coatings, such as PC1-1500 series available from Futurrex, Newton, N.J.

The thickness "t" of the planarization layer 18 depends on the height "d" of the bump 16 in the insulating layer 14. Typically, for bumps having a thickness in the range from 2000 to 10,000 Å, the thickness "t" of the planarization layer 18 will be in the range from about 10,000 to 60,000 Å.

According to the present invention, the next step is to remove or "etch back" the planarization layer 18 and a portion of the insulating layer 14, usually down to the upper surface of metallization lines 12, as indicated by broken line 22. Such removal will be accomplished by a two-step plasma etching process. First, an oxygen-containing plasma is utilized to remove a first region $R_1$ of the planarization layer 18 down to the interface between the planarization layer and the top of the bumps 16 of the insulating layer 14. This interface is indicated generally by broken line 24 in FIG. 2, and the structure resulting from the first etch is illustrated in FIG. 3. Second, a plasma including a halocarbon etchant and having a reduced oxygen content is employed for removing a second region $R_2$ of the combined planarization and insulating layers. Usually, the region $R_2$ is etched back sufficiently to expose the upper surface of the metallization layer 12, although in some cases it may be desirable to leave a portion of the insulating material overlying the metallization. In the latter case, holes or vias may be formed through the remaining insulation to allow for vertical interconnection to succeeding metallization layers (not illustrated). FIG. 4 illustrates the case where the insulating layer 14 has been etched back fully to line 22 (FIG. 2).

It has been found by the inventors herein that by employing a parallel electrode plasma reactor operating at low radio frequency, typically below about 5 MHz usually in the range from 0.4 to 5 MHz, and at a high pressure, typicaly above 1 Torr., more typically in the range from about 1 to 5 Torr., that very rapid and uniform etching of the planarization layer and combined planarization and insulating layers may be achieved. In particular, using an oxygen-containing etchant gas, etch rates exceeding 20,000 Å per minute, frequently exceeding 30,000 Å per minute, and up to 50,000 Å per minute or more, may be achieved for the organic planarization material. This is a very important consideration when relatively thick planarization layers, on the order of from 10,000 to 60,000 Å, must be removed. In contrast, conventional high frequency, low pressure plasma etching in a batch system achieves etch rates on the order of 1000 Å per minute. Thus, the process of the present invention reduces the time necessary to remove region $R_1$ of the planarization layer from a period of tens of minutes down to a period on the order from 1 to 2 minutes.

The oxygen containing etchant gas will usually be substantially pure oxygen ($O_2$) which is excited by the rf energy to active oxygen species, primarily atomic oxygen and $O_2^+$. The active oxygen reacts with the organic planarization material resulting in volatile reaction products, primarily CO, $CO_2$ and $H_2O$. Additives may be supplied to the oxygen etchant to inhibit recombination of the active oxygen species within the plasma reactor. The flow rate of the oxygen etchant will vary depending on the particular plasma reactor utilized. Typically, flow rates will be above about 0.5 cm$^3$/min cm$^2$ based on the area of the wafer, more typically being in the range from about 0.5 to 1.5 cm$^3$/min cm$^2$.

The plasma reactor will be operated with a conventional radio frequency (rf) excitation power source operating at the desired frequency. The power applied to the electrodes will usually be in the range from about 1 to 5 watts/cm$^2$ (based on the area of the electrodes), more usually in the range from about 2.5 to 5.0 watts/cm$^2$. Operation at higher powers, although achievable, usually results in a loss of uniformity of the etch. Operation at lower powers results in an undesirable slowing of the etch rate.

The etching of region $R_2$, where the combined insulating and planarization layers are removed with a halocarbon etchant (or other fluorine rich gases such as $NF_3$ and $SF_6$), is also improved by use of a parallel plate plasma reactor operating at the frequency and pressure set forth above. Under these operation conditions, the insulating layer 14 is removed by an ion bombardment enhanced mechanism, which is of higher energy than with high frequency, low pressure plasma etching. Moreover, by limiting the addition of extrinsic oxygen to the etchant gas, overetching of the planarization layer 18 is avoided. It has been observed by the inventors herein that under the conditions outlined above, the etching of the silicon dioxide insulating layer 14 liberates sufficient active oxygen species which contribute to the etching of the organic planarization layer 18. By reducing or eliminating the extrinsic oxygen introduced to the system via the etchant gas, overetching of the planarization layer is prevented. Such overetching would result in degradation of the insulating layer between adjacent metallization or conductive lines. In the preferred embodiment, no oxygen is introduced by the etchant gas.

Suitable halocarbon etchants are well known and include $CF_4$, $C_2F_6$, $C_3F_8$, $CF_3Br$, $CHF_3$, $C_4F_8$, and the like. the halocarbon or fluorine rich etchant will usually be combined with an inert carrier gas, usually argon, to allow increased operating pressures (above 1 Torr.) without an unacceptable increase in recombination between dissociated species. The increased pressure also allows attainment of a high etchant gas flow (usually above about 3.0 cm$^3$/min. cm$^2$, more usually above about 4.0 cm$^3$/min. cm$^2$) which has been found to contribute to enhanced uniformity of etching. Usually, the ratio of halocarbon etchant to inert carrier will be in the range from 0.25 to 0.75, more usually from 0.3 to 0.5 by volume.

Suitable parallel electrode plasma reactors must be capable of operation within the high pressure (above about 1 Torr.) and low frequency (0.4 to 5 MHz) conditions required by the process of the present invention. Such reactors are available from Perkin-Elmer Corporation.

It is preferred that only one wafer be processed at a time. Suitable single wafer reactors are available. By processing one wafer at a time, wafer to wafer variations are avoided. Moreover, endpoint control based on spectral emissions of species generated or consumed in the plasma during the etch or changes in the optical interference pattern may be directly related to the single wafer, allowing for precise control of the etch and avoiding the over-etch and under-etch associated with previous batch etching processes. The rapid etch rates achieved by the method of the present invention allow for use of single wafer reactor because of the relatively short processing time required.

Although the foregoing invention has been described in some detail by way of illustration and example for purpose of clarity of understanding, it will be obvious that certain changes and modifications may be practiced within the scope of the appended claims.

What is claimed is:

1. A method for planarizing an insulating layer and exposing underlying topographic features, said method comprising:
   applying a planarization layer over the insulating layer to thickness sufficient to form a substantially level surface;
   uniformly etching the planarization layer with a first plasma down to about the interface between the planarization layer and the insulating layer; and
   uniformly etching the remaining planarization layer and insulating layer with a second plasma selected to preferentially etch the insulating layer.

2. A method as in claim 1, wherein a conductive layer at least partly defines the underlying topographic features.

3. A method as in claim 2, wherein the planarization layer is applied by spinning a liquid photoresist or planarizing coating.

4. A method as in claim 3, wherein the thickness of the photoresist is at least 10,000 Å.

5. A method as in claim 1, wherein the planarization layer is etched in an oxygen-containing plasma.

6. A method as in claim 5, wherein the etching of the planarization layer is performed in a parallel electrode reactor at low frequency under high pressure.

7. A method as in claim 6, wherein the frequency is below about 1 MHz and the pressure is above about 1 Torr.

8. A method as in claim 1, wherein the etching of the combined planarization layer and insulating layer is performed in a plasma having a reduced oxygen content relative to the first plasma.

9. A method as in claim 8, wherein the plasma has no extrinsically introduced oxygen.

10. A method as in claim 1, wherein the first plasma contains oxygen and the second plasma is substantially free from extrinsically introduced oxygen but contains a halocarbon or fluorine rich etchant.

11. A method as in claim 8, wherein the etching of the combined planarization layer and insulating layer is performed in a parallel electrode reactor at low frequency under high pressure.

12. A method as in claim 11, wherein the frequency is below about 1 MHz and the pressure is above about 1 Torr.

13. A method for planarizing a silicon dioxide insulating layer and exposing underlying topographic features, said method comprising:
applying an organic planarization layer over the insulating layer to a thickness sufficient to form a substantially level surface;
etching the planarization layer with an oxygen plasma down to about the interface between the planarization layer and the insulating layer; and
etching the combined planarization layer and insulating layer with a reduced oxygen plasma generated in a low frequency, high pressure parallel electrode reactor, whereby the insulating layer is preferentially etched relative to the planarizing layer.

14. A method as in claim 13, wherein a conductive layer at least partly defines the underlying topographic features.

15. A method as in claim 14, wherein the conductive layer has a thickness over 2000 Å and the thickness of the planarization layer is at least 20,000 Å above the metallization layer.

16. A method as in claim 15, wherein the first plasma contains oxygen and etching of the planarization layer is performed in a parallel electrode reactor at low frequency under high pressure, whereby etching rates above 20,000 Å per minute may be achieved with high uniformity.

17. A method as in claim 16, wherein the frequency is below about 1 MHz and the pressure is above about 1 Torr.

18. A method as in claim 14, wherein the second plasma is substantially free from extrinsically introduced oxygen.

19. A method as in claim 18 wherein the frequency is below about 1 MHz and the pressure is above about 1 Torr.

20. An improved method for planarizing an insulating layer on a semiconductor substrate, said method being of the type wherein an organic polymeric planarization layer is applied over the insulating layer and thereafter both the planarizing layer and the insulating layer are etched to leave a substantially planar surface, said improvement comprising etching the planarization and insulating layers with a low frequency, high pressure plasma in a parallel electrode reactor, wherein the frequency is below about 1 MHz and the pressure is above about 1 Torr.

21. An improved method as in claim 20, wherein the planarization layer is initially etched with an oxygen-containing plasma at a rate exceeding 20,000 Å per minute until the interface between the insulating and planarization layers is reached.

22. An improved method as in claim 21, wherein the combined planarization and insulating layer is etched with a halocarbon or fluorine rich etchant substantially free from extrinsically introduced oxygen so that the insulating layer is preferentially etched.

23. An improved method as in claim 22, wherein the halocarbon etchant is $CF_4$.

24. An improved method as in claim 21, wherein the power density of the reactor is maintained in the range from about 1 to 5 watts/$cm^2$.

25. An improved method as in claim 20, wherein the planarizing layer is composed of a photoresist.

26. An improved method as in claim 20, wherein a single wafer is etched in the reactor and the endpoint of the etch is determined by observing spectral emissions in the plasma from species generated or consumed during the etch or by changes in the optical interference pattern by laser interferometry.

* * * * *